(12) United States Patent
Miyake

(10) Patent No.: US 11,636,819 B2
(45) Date of Patent: *Apr. 25, 2023

(54) DISPLAY DEVICE

(71) Applicant: SEMICONDUCTOR ENERGY LABORATORY CO., LTD., Atsugi (JP)

(72) Inventor: Hiroyuki Miyake, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/134,724

(22) Filed: Dec. 28, 2020

(65) Prior Publication Data

US 2021/0225314 A1 Jul. 22, 2021

Related U.S. Application Data

(63) Continuation of application No. 16/190,205, filed on Nov. 14, 2018, now Pat. No. 10,885,861, which is a (Continued)

(30) Foreign Application Priority Data

Sep. 12, 2013 (JP) .................. 2013-189539

(51) Int. Cl.
*G09G 3/36* (2006.01)
*G11C 19/28* (2006.01)
(Continued)

(52) U.S. Cl.
CPC .......... *G09G 3/3677* (2013.01); *G11C 19/28* (2013.01); *G11C 19/287* (2013.01);
(Continued)

(58) Field of Classification Search
CPC ......... G09G 3/3677; G09G 2300/0814; G09G 2310/0286; G09G 2310/06;
(Continued)

(56) References Cited

U.S. PATENT DOCUMENTS

| 5,602,560 A | 2/1997 | Ikeda |
| 5,892,495 A | 4/1999 | Sakai et al. |

(Continued)

FOREIGN PATENT DOCUMENTS

| CN | 202838908 U | 3/2013 |
| EP | 1130565 A | 9/2001 |

(Continued)

OTHER PUBLICATIONS

Taiwanese Office Action (Application No. 103131369) dated Jun. 13, 2018.

(Continued)

*Primary Examiner* — Thuy N Pardo
(74) *Attorney, Agent, or Firm* — Nixon Peabody LLP; Jeffrey L. Costellia

(57) ABSTRACT

A scan line to which a selection signal or a non-selection signal is input from its end, and a transistor in which a clock signal is input to a gate, the non-selection signal is input to a source, and a drain is connected to the scan line are provided. A signal input to the end of the scan line is switched from the selection signal to the non-selection signal at the same or substantially the same time as the transistor is turned on. The non-selection signal is input not only from one end but also from both ends of the scan line. This makes it possible to inhibit the potentials of portions in the scan line from being changed at different times.

5 Claims, 12 Drawing Sheets

Related U.S. Application Data continuation of application No. 15/852,669, filed on Dec. 22, 2017, now Pat. No. 10,147,378, which is a continuation of application No. 15/433,629, filed on Feb. 15, 2017, now Pat. No. 9,852,708, which is a continuation of application No. 14/474,330, filed on Sep. 2, 2014, now Pat. No. 9,583,063.

(51) Int. Cl.
    *G02F 1/1343*     (2006.01)
    *G02F 1/1362*     (2006.01)
    *G02F 1/1368*     (2006.01)

(52) U.S. Cl.
    CPC ...... *G02F 1/1368* (2013.01); *G02F 1/134336* (2013.01); *G02F 1/136286* (2013.01); *G09G 2300/0814* (2013.01); *G09G 2310/0286* (2013.01); *G09G 2310/06* (2013.01); *G09G 2310/08* (2013.01); *G09G 2320/0223* (2013.01); *G09G 2330/021* (2013.01)

(58) Field of Classification Search
    CPC ....... G09G 2310/08; G09G 2320/0223; G09G 2330/021; G09G 3/3648; G09G 3/3674; G09G 2310/0267; G09G 2320/0219; G02F 1/134336; G02F 1/136286; G02F 1/1368; G11C 19/28; G11C 19/287
    USPC .................. 345/92, 211, 204, 100, 547, 691
    See application file for complete search history.

(56) References Cited

U.S. PATENT DOCUMENTS

| | | | |
|---|---|---|---|
| 6,859,193 B1 | 2/2005 | Yumoto | |
| 7,138,975 B2 | 11/2006 | Koyama | |
| 7,180,479 B2 | 2/2007 | Kimura | |
| 7,193,591 B2 | 3/2007 | Yumoto | |
| 7,245,277 B2 | 7/2007 | Ishizu | |
| 7,332,742 B2 | 2/2008 | Miyake et al. | |
| 7,379,039 B2 | 5/2008 | Yumoto | |
| 7,388,564 B2 | 6/2008 | Yumoto | |
| 7,548,228 B2 | 6/2009 | Pak et al. | |
| 7,674,650 B2 | 3/2010 | Akimoto et al. | |
| 7,724,245 B2 | 5/2010 | Miyazawa | |
| 7,817,117 B2 | 10/2010 | Kimura | |
| 7,825,879 B2 | 11/2010 | Yamashita et al. | |
| 7,859,510 B2 | 12/2010 | Umezaki | |
| 7,982,696 B2 | 7/2011 | Kimura | |
| 7,982,697 B2 | 7/2011 | Kasai et al. | |
| 8,054,279 B2 | 11/2011 | Umezaki et al. | |
| 8,164,547 B2 | 4/2012 | Kimura | |
| 8,164,548 B2 | 4/2012 | Kimura | |
| 8,217,878 B2 | 7/2012 | Yamashita et al. | |
| 8,223,111 B2 | 7/2012 | Liao et al. | |
| 8,305,309 B2 | 11/2012 | Tomida et al. | |
| 8,330,492 B2 | 12/2012 | Umezaki | |
| 8,427,417 B2 | 4/2013 | Koyama | |
| 8,441,424 B2 | 5/2013 | Lee | |
| 8,462,098 B2 | 6/2013 | Tobita | |
| 8,599,115 B2 | 12/2013 | Kimura | |
| 8,624,802 B2 | 1/2014 | Kimura | |
| 8,692,744 B2 | 4/2014 | Yamashita et al. | |
| 8,743,044 B2 | 6/2014 | Umezaki et al. | |
| 8,773,335 B2 | 7/2014 | Yamashita et al. | |
| 8,803,782 B2 | 8/2014 | Ochiai et al. | |
| 8,803,783 B2 | 8/2014 | Ochiai et al. | |
| 8,810,498 B2 | 8/2014 | Kim et al. | |
| 8,872,739 B2 | 10/2014 | Kimura | |
| 8,902,145 B2 | 12/2014 | Umezaki et al. | |
| 8,913,044 B2 | 12/2014 | Miyazawa | |
| 8,982,016 B2 | 3/2015 | Yamashita et al. | |
| 8,982,033 B2 | 3/2015 | Ochiai et al. | |
| 8,994,636 B2 | 3/2015 | Umezaki | |
| 9,041,630 B2 | 5/2015 | Kimura | |
| 9,070,593 B2 | 6/2015 | Umezaki | |
| 9,076,403 B2 | 7/2015 | Ochiai et al. | |
| 9,129,553 B2 | 9/2015 | Yamashita et al. | |
| 9,214,121 B2 | 12/2015 | Toyotaka et al. | |
| 9,214,473 B2 | 12/2015 | Umezaki | |
| 9,218,780 B2 | 12/2015 | Chen | |
| 9,379,142 B2 | 6/2016 | Kimura | |
| 9,406,258 B2 | 8/2016 | Yamashita et al. | |
| 9,406,399 B2 | 8/2016 | Ochiai et al. | |
| 9,448,451 B2 | 9/2016 | Toyotaka et al. | |
| 9,461,071 B2 | 10/2016 | Umezaki | |
| 9,536,903 B2 | 1/2017 | Umezaki et al. | |
| 9,569,996 B2 | 2/2017 | Kimura | |
| 9,620,059 B2 | 4/2017 | Yamashita et al. | |
| 9,734,780 B2 | 8/2017 | Miyake et al. | |
| 9,842,861 B2 | 12/2017 | Umezaki et al. | |
| 9,870,736 B2 | 1/2018 | Yamashita et al. | |
| 9,881,691 B2 | 1/2018 | Ochiai et al. | |
| 9,954,010 B2 | 4/2018 | Umezaki | |
| 10,008,169 B2 | 6/2018 | Miyake et al. | |
| 10,210,945 B2 | 2/2019 | Ochiai et al. | |
| 10,297,618 B2 | 5/2019 | Umezaki et al. | |
| 10,304,868 B2 | 5/2019 | Umezaki | |
| 10,573,233 B2 | 2/2020 | Yamashita et al. | |
| 10,720,452 B2 | 7/2020 | Umezaki | |
| 10,930,683 B2 | 2/2021 | Umezaki et al. | |
| 2002/0075216 A1* | 6/2002 | Satake | G09G 3/3648 345/89 |
| 2004/0239655 A1 | 12/2004 | Tani et al. | |
| 2005/0052400 A1* | 3/2005 | Kim | G02F 1/136286 345/100 |
| 2007/0001945 A1 | 1/2007 | Yoshida et al. | |
| 2007/0070061 A1 | 3/2007 | Koyama | |
| 2008/0001882 A1 | 1/2008 | Lee | |
| 2008/0079685 A1 | 4/2008 | Umezaki et al. | |
| 2009/0051674 A1 | 2/2009 | Kimura et al. | |
| 2009/0267873 A1 | 10/2009 | Ishii et al. | |
| 2010/0073406 A1* | 3/2010 | Shishido | G09G 3/3258 345/691 |
| 2010/0245305 A1 | 9/2010 | Yokoyama et al. | |
| 2010/0315403 A1* | 12/2010 | Kaneyoshi | G09G 3/3614 345/211 |
| 2010/0327955 A1 | 12/2010 | Umezaki | |
| 2011/0115839 A1 | 5/2011 | Takahashi et al. | |
| 2011/0187762 A1 | 8/2011 | Osame et al. | |
| 2011/0292008 A1 | 12/2011 | Iwabuchi et al. | |
| 2012/0002127 A1* | 1/2012 | Yamazaki | G09G 3/3677 349/68 |
| 2012/0056860 A1 | 3/2012 | Umezaki et al. | |
| 2012/0062528 A1 | 3/2012 | Kimura et al. | |
| 2012/0081409 A1 | 4/2012 | Chung | |
| 2012/0235974 A1* | 9/2012 | Kimura | G09G 3/3283 345/204 |
| 2012/0313923 A1 | 12/2012 | Minami et al. | |
| 2013/0002642 A1 | 1/2013 | Tomida et al. | |
| 2013/0077735 A1 | 3/2013 | Hirose | |
| 2013/0222220 A1* | 8/2013 | Tobita | H01L 29/94 345/100 |
| 2013/0286001 A1 | 10/2013 | Nakano et al. | |
| 2014/0002423 A1 | 1/2014 | Choi et al. | |
| 2014/0117358 A1 | 5/2014 | Tobita | |
| 2014/0152712 A1* | 6/2014 | Shishido | G09G 3/2003 345/83 |
| 2014/0204004 A1 | 7/2014 | Tomida et al. | |
| 2014/0266304 A1 | 9/2014 | Hirose | |
| 2014/0340288 A1 | 11/2014 | Yamashita et al. | |
| 2015/0103060 A1* | 4/2015 | Yamashita | G09G 3/3266 345/76 |
| 2015/0179104 A1 | 6/2015 | Miyazawa | |
| 2015/0269896 A1 | 9/2015 | Umezaki | |
| 2015/0340015 A1* | 11/2015 | Yoshida | G09G 5/39 345/547 |
| 2016/0035275 A1* | 2/2016 | Yamazaki | H01L 27/1225 345/212 |
| 2016/0117966 A1 | 4/2016 | Yoshida | |
| 2016/0322014 A1 | 11/2016 | Yoshida | |
| 2019/0156905 A1 | 5/2019 | Ochiai et al. | |

(56) References Cited

U.S. PATENT DOCUMENTS

| | | | |
|---|---|---|---|
| 2019/0371241 A1* | 12/2019 | Toyotaka | G09G 3/3233 |
| 2020/0144300 A1 | 5/2020 | Umezaki | |
| 2020/0150473 A1 | 5/2020 | Umezaki et al. | |
| 2020/0168151 A1 | 5/2020 | Yamashita et al. | |
| 2020/0295050 A1 | 9/2020 | Umezaki | |
| 2021/0201834 A1* | 7/2021 | Yamazaki | G09G 3/3413 |
| 2021/0249444 A1* | 8/2021 | Kimura | H01L 27/1225 |
| 2021/0320129 A1* | 10/2021 | Umezaki | H01L 27/1214 |

FOREIGN PATENT DOCUMENTS

| | | |
|---|---|---|
| EP | 1381019 A | 1/2004 |
| EP | 1447787 A | 8/2004 |
| EP | 1906414 A | 4/2008 |
| EP | 2400485 A | 12/2011 |
| EP | 2400501 A | 12/2011 |
| EP | 2711921 A | 3/2014 |
| EP | 3223283 A | 9/2017 |
| JP | 63-052121 A | 3/1988 |
| JP | 07-270754 A | 10/1995 |
| JP | 07-294882 A | 11/1995 |
| JP | 10-253940 A | 9/1998 |
| JP | 2000-034628 A | 2/2000 |
| JP | 2002-055660 A | 2/2002 |
| JP | 2003-108074 A | 4/2003 |
| JP | 2004-045647 A | 2/2004 |
| JP | 2005-250382 A | 9/2005 |
| JP | 2006-106786 A | 4/2006 |
| JP | 2006-285233 A | 10/2006 |
| JP | 2008-009368 A | 1/2008 |
| JP | 2008-040024 A | 2/2008 |
| JP | 2008-070406 A | 3/2008 |
| JP | 2008-096794 A | 4/2008 |
| JP | 4126909 | 7/2008 |
| JP | 2008-216436 A | 9/2008 |
| JP | 2008-287196 A | 11/2008 |
| JP | 2009-025428 A | 2/2009 |
| JP | 2010-002812 A | 1/2010 |
| JP | 2010-218673 A | 9/2010 |
| JP | 2011-028159 A | 2/2011 |
| JP | 2011-028237 A | 2/2011 |
| JP | 2011-164534 A | 8/2011 |
| JP | 2011-170327 A | 9/2011 |
| JP | 2011-232730 A | 11/2011 |
| JP | 2012-009094 A | 1/2012 |
| JP | 2012-198543 A | 10/2012 |
| JP | 2012-238003 A | 12/2012 |
| JP | 2013-030263 A | 2/2013 |
| JP | 2014-063164 A | 4/2014 |
| KR | 1997-0029315 A | 6/1997 |
| KR | 2008-0057144 A | 6/2008 |
| KR | 2013-0094218 A | 8/2013 |
| TW | 200634712 | 10/2006 |
| TW | 200701167 | 1/2007 |
| TW | 200802263 | 1/2008 |
| TW | 201133459 | 10/2011 |
| TW | 201214386 | 4/2012 |
| TW | 201214450 | 4/2012 |
| TW | 201220316 | 5/2012 |
| WO | WO-2003/038795 | 5/2003 |
| WO | WO-2003/060867 | 7/2003 |
| WO | WO-2008/105447 | 9/2008 |
| WO | WO-2010/150607 | 12/2010 |
| WO | WO-2011/033909 | 3/2011 |
| WO | WO-2011/089842 | 7/2011 |
| WO | WO-2012/002040 | 1/2012 |

OTHER PUBLICATIONS

Taiwanese Office Action (Application No. 109114824) dated May 24, 2021.

* cited by examiner

DISPLAY DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a driving method thereof, or a manufacturing method thereof. In particular, one embodiment of the present invention relates to an active matrix display device.

2. Description of the Related Art

In the active matrix display device, a plurality of pixels are arranged in matrix. Each of the pixels displays a specific color in response to an image signal, which allows the whole display device to display a desired image.

In each of the pixels, a transistor for rewriting the image signal is provided. A gate of the transistor is connected to a scan line. The potential of the scan line is controlled to control switching of the transistor. Note that the scan line is connected to the gates of the transistors included in the plurality of pixels arranged in a specific row. That is, in the active matrix display device, rewriting of the image signal is performed for each specific row.

In the active matrix display device, the number of scan lines is the same as the number of rows of the plurality of pixels arranged in matrix. Scan line driver circuits that control the potentials of the scan lines are provided in the active matrix display device. The scan line driver circuits can be collectively provided on one side of the plurality of pixels arranged in matrix; alternatively, the scan line driver circuits can be separately provided (a first scan line driver circuit and a second scan line driver circuit can be provided) on the both sides thereof (see Patent Documents 1 and 2).

REFERENCE

Patent Document

[Patent Document 1] U.S. Pat. No. 8,462,098
[Patent Document 2] United States Published Patent Application No. 2012-0062528

SUMMARY OF THE INVENTION

In a scan line, influence of wiring resistance and parasitic capacitance becomes obvious easily. Specifically, because the scan line extends along a plurality of pixels arranged in a specific row, the total length of the scan line is necessarily increased and wiring resistance is easily increased. The scan line intersects with a plurality of signal lines (i.e., wirings serving as image signal input paths of the pixels) and are connected to gates of a plurality of transistors. For this reason, parasitic capacitance generated at intersections with the signal lines and gate capacitance of the transistors connected to the scan line are added to the scan line; thus, the parasitic capacitance is easily increased. In addition, in the case where a display device is increased in size and the number of pixels is increased, the influence is further increased. This is because the total length of the scan line is further increased with an increase in the size of the display device, and the number of signal lines intersecting with the scan line and the number of transistors connected to the scan line are increased with an increase in the number of pixels in the display device.

Here, when the wiring resistance and the parasitic capacitance are increased, a problem might occur in the display device. Specifically, when a signal is input to the scan line, the potential of a portion where the signal is input is changed, and then the potential of a portion apart from the input portion is changed. That is, in the scan line, depending on the portions, the potentials are changed at different times. The time lag is increased in proportion to the wiring resistance and the parasitic capacitance. Thus, increases in the wiring resistance and the parasitic capacitance in the scan line increases the time lag in switching the plurality of transistors whose gates are connected to the scan line. Consequently, the problem might be caused in the display device.

Note that the expression "time lag in switching transistors" refers to the following two cases: a case where the transistors are turned on at different times and a case where the transistors are turned off at different times. In the active matrix display device, in particular, the problem is likely to occur in the latter case. This is because when the transistors are turned off at different times, probability that an image signal different from a desired image signal is input to the pixel is increased.

In view of the above, an object of one embodiment of the present invention is to inhibit the potentials of portions in a scan line from being changed at different times. Another object of one embodiment of the present invention is to inhibit a plurality of transistors whose gates are connected to a scan line from being switched at different times. Another object of one embodiment of the present invention is to reduce a problem occurring in a display device. Another object of one embodiment of the present invention is to provide a novel display device. Note that one embodiment of the present invention aims to achieve at least one of the above objects. The descriptions of these objects do not disturb the existence of other objects. Other objects are apparent from and can be derived from the description of the specification, the drawings, the claims, and the like.

The main point of one embodiment of the present invention is to input a non-selection signal not only from one end but also from both ends of a scan line when a signal input to the scan line is switched from a selection signal to the non-selection signal. Note that in this specification, the "selection signal" refers to a signal for turning on a transistor whose gate is connected to a scan line, and the "non-selection signal" refers to a signal for turning off the transistor.

An example of one embodiment of the present invention is a display device including a scan line to which a selection signal or a non-selection signal is input from its end, and a transistor in which a clock signal is input to a gate and the non-selection signal is input to a source. The other end of the scan line is electrically connected to a drain of the transistor. A signal input to the scan line from its end is switched from the selection signal to the non-selection signal at the same or substantially the same time as the transistor is turned on.

In the display device of one embodiment of the present invention, the non-selection signal is input to the scan line not only from its end but also from its both ends. This makes it possible to inhibit the potentials of portions in the scan line from being changed at different times. In addition, this makes it possible to inhibit a plurality of transistors whose gates are connected to the scan line from being switched at different times. Consequently, it is possible to reduce a problem that occurs in the display device.

DETAILED DESCRIPTION OF THE INVENTION

Figure 1A:
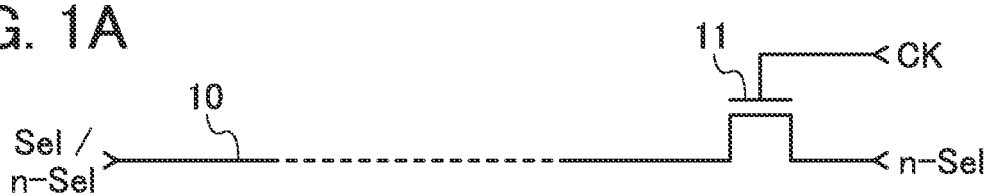
FIGS. 1A, 1B, and 1D illustrate configuration examples of a display device.

Embodiments of the present invention will be described below in detail. Note that the present invention is not limited to the description below, and a variety of changes can be made without departing from the spirit and scope of the present invention. Therefore, the present invention is not construed as being limited to the description given below.

In this specification and the like, when it is explicitly described that X and Y are connected, the case where X and Y are electrically connected, the case where X and Y are functionally connected, and the case where X and Y are directly connected are included therein. Accordingly, another element may be provided between elements having a connection relation illustrated in drawings and texts, without limitation on a predetermined connection relation, for example, the connection relation illustrated in the drawings and the texts.

Here, X and Y each denote an object (e.g., a device, an element, a circuit, a wiring, an electrode, a terminal, a conductive film, a layer, or the like).

An example of the case where X and Y are directly connected is the case where an element that allows an electrical connection between X and Y (e.g., a switch, a transistor, a capacitor, an inductor, a resistor, a diode, a display element, a light-emitting element, and a load) is not connected between X and Y, and X and Y are connected without the element that allows the electrical connection between X and Y provided therebetween.

In an example of the case where X and Y are electrically connected, one or more elements that allows an electrical connection between X and Y (e.g., a switch, a transistor, a capacitor, an inductor, a resistor, a diode, a display element, a light-emitting element, or a load) can be connected between X and Y. A switch is controlled to be on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that allows a functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. When a signal output from X is transmitted to Y, it can be said that X and Y are functionally connected even if another circuit is provided between X and Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order"; "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order"; and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expression are as follows: "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor through the transistor, the first connection path is a path through which Z1 is provided, the drain (or the second terminal or the like) of the transistor is electrically connected to Y through at least a third connection path, the third connection path does not include the second connection path, and the third connection path is a path through which Z2 is provided"; "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path"; and "a source (or a first terminal or the like) of a transistor is electrically connected to X at least with a first electrical path through Z1, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y at least with a third electrical path through Z2, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<1. Configuration Example of Display Device>

A display device of one embodiment of the present invention is described with reference to FIG. 1A. In FIG. 1A, part of the display device is illustrated. FIG. 1A illustrates a scan line 10 in which a selection signal (Set) or a non-selection signal (n-Sel) is input to one end, and a transistor 11 in which a clock signal (CK) is input to a gate and the non-selection signal (n-Sel) is input to a source. The other end of the scan line 10 is connected to a drain of the transistor 11. In FIG. 1A, a signal is input to the scan line 10 so that the signal input from the one end is switched from the selection signal (Sel) to the non-selection signal (n-Sel) at the same or substantially the same time as the transistor 11 is turned on. Although an n-channel transistor is illustrated as the transistor 11 in FIG. 1A, the transistor 11 may be a p-channel transistor.

Figure 1B:
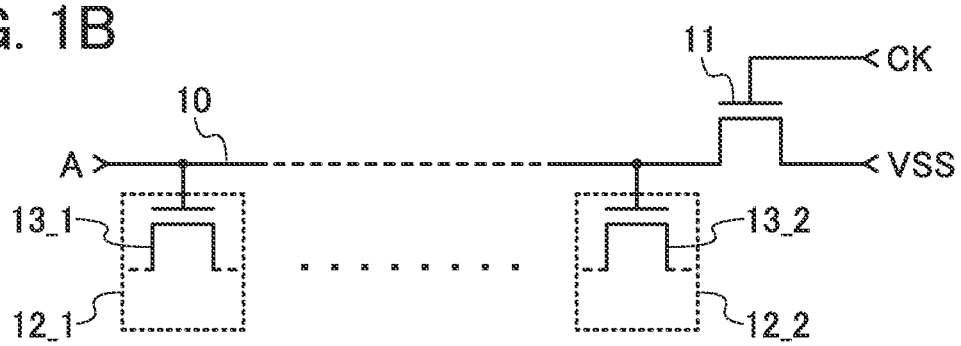
Figure 1C:
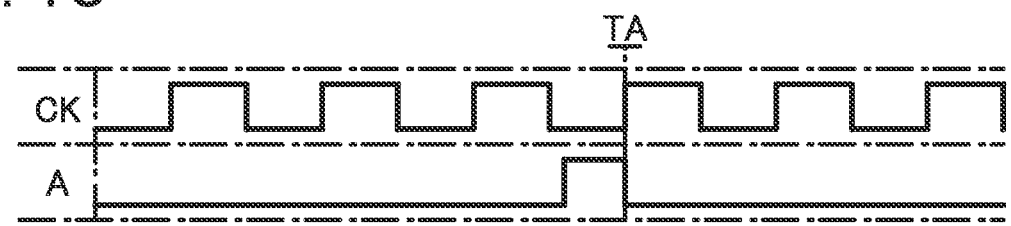
FIGS. 1C and 1E illustrate signal waveforms.

In an actual display device, the scan line 10 is connected to gates of transistors included in a plurality of pixels arranged in one specific row. In FIG. 1B, pixels 12_1 and 12_2 and transistors 13_1 and 13_2 included in the pixels 12_1 and 12_2, respectively (hereinafter such transistors are referred to as pixel transistors) are included in the configuration illustrated in FIG. 1A. When the transistors 13_1 and 13_2 are n-channel transistors as illustrated in FIG. 1B, a high power supply potential (VDD) is the selection signal and a low power supply potential (VSS) is the non-selection signal. FIG. 1C illustrates an example of waveforms of the signals in FIG. 1B. As illustrated in FIG. 1C, a signal is input to the scan line 10 in FIG. 1B so that a timing (TA) at which the signal input to one end is switched from the high power supply potential (VDD) to the low power supply potential (VSS) corresponds to a timing at which the clock signal (CK) is switched from the low power supply potential (VSS) to the high power supply potential (VDD). Note that although the clock signal (CK) alternates between the high power supply potential (VDD) and the low power supply potential (VSS) and has a duty ratio of ½ in FIG. 1C, at least one of the high power supply potential (VDD) and the low power supply potential (VSS) may be substituted with another potential, and a duty ratio of the signal may be other than ½.

As illustrated in FIG. 1C, in a period during which the high power supply potential (VDD) is supplied to the scan line 10, the transistor 11 is preferably kept in an off state. That is, in the period, the clock signal (CK) is preferably kept at the low power supply potential (VSS). This makes is possible to inhibit flow of a wasted current from the one end to the other end of the scan line 10; thus, increase in malfunction and power consumption can be inhibited in the display device.

Figure 1D:
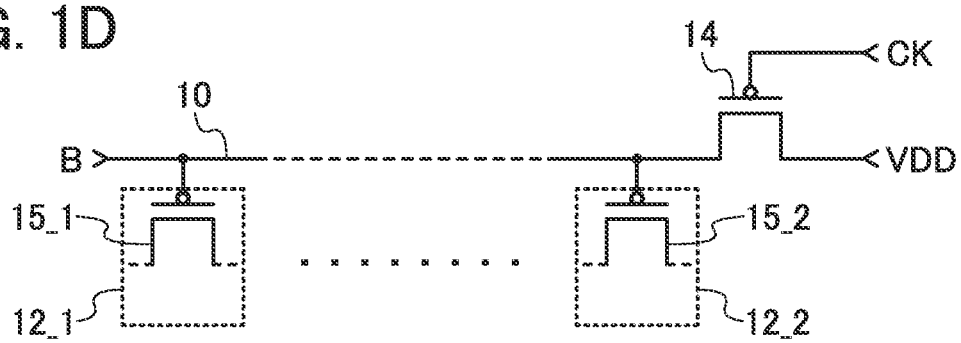
Figure 1E:
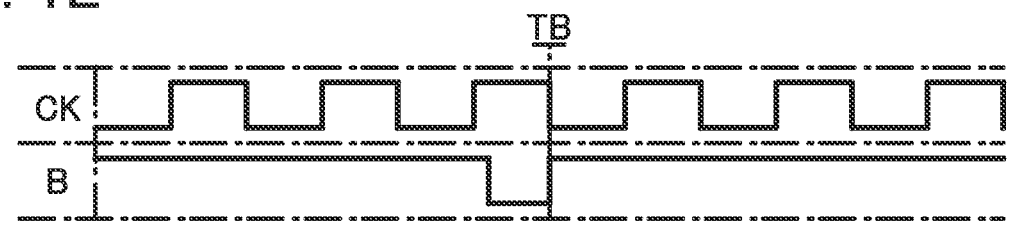

FIG. 1D illustrates a configuration in which the transistors 11, 13_1, and 13_2 in FIG. 1B are substituted with p-channel transistors 14, 15_1, and 15_2. In this case, the high power supply potential (VDD) is the non-selection signal, and the low power supply potential (VSS) is the selection signal. FIG. 1E illustrates an example of waveforms of the signals in FIG. 1D. As illustrated in FIG. 1E, a signal is input to the scan line 10 in FIG. 1D so that a timing (TB) at which the signal input from the one end is switched from the low power supply potential (VSS) to the high power supply potential (VDD) corresponds to a timing at which the clock signal (CK) is switched from the high power supply potential (VDD) to the low power supply potential (VSS).

Note that as illustrated in FIG. 1B, the transistor 11 whose drain is connected to the other end of the scan line 10 and the transistors 13_1 and 13_2 whose gates are connected to the scan line 10 preferably have the same polarity; as illustrated in FIG. 1D, the transistor 14 whose drain is connected to the other end of the scan line 10 and the transistors 15_1 and 15_2 whose gates are connected to the scan line 10 preferably have the same polarity. Specifically, the number of manufacturing steps can be small as compared to the case where the transistor 11 has different polarity from the transistors 13_1 and 13_2 or the case where the transistor 14 has different polarity from the transistors 15_1 and 15_2, which is preferable. In the case where the transistor 11 has different polarity from the transistors 13_1 and 13_2, the transistor 14 has different polarity from the transistors 15_1 and 15_2, and the clock signal (CK) has a potential corresponding to the selection signal and a potential corresponding to the non-selection signal, the non-selection signal is input not to the source but to the drain of the transistor 11 or 14. In this case, to a gate of a transistor that is connected to the scan line 10, not a potential corresponding to the non-selection signal but a potential which changes from the potential corresponding to the non-selection signal by the threshold voltage of the transistor 11 or 14 is input.

Figure 2A:
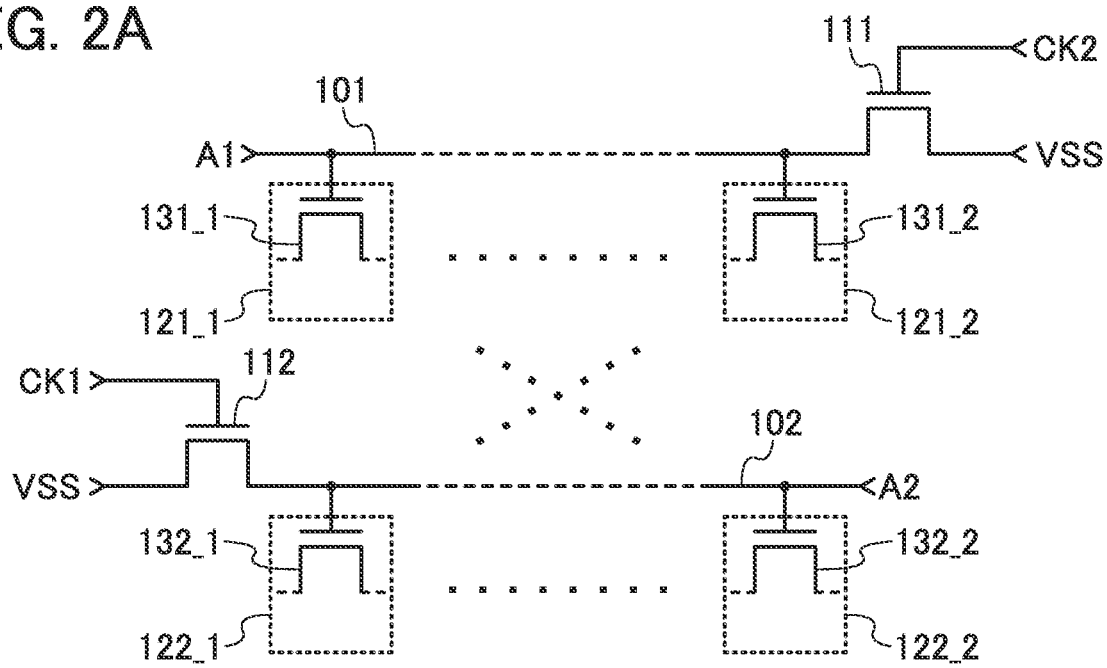
FIG. 2A illustrates a configuration example of a display device.

FIG. 2A illustrates part of a display device of one embodiment of the present invention. FIG. 2A illustrates a scan line 101 to which a signal (A1) is input from the left side, a scan line 102 to which a signal (A2) is input from the right side, a transistor 111 in which a clock signal (CK2) is input to a gate and the low power supply potential (VSS) is input to a source, and a transistor 112 in which a clock signal (CK1) is input to a gate and the low power supply potential (VSS) is input to a source. One end of the scan line 101 on the right side is connected to a drain of the transistor 111, and one end of the scan line 102 on the left side is connected to a drain of the transistor 112. FIG. 2A also illustrates pixels 121_1, 121_2, 122_1, and 122_2 and transistors 131_1, 131_2, 132_1, and 132_2. Note that the transistors 111, 112, 131_1, 131_2, 132_1, and 132_2 are n-channel transistors.

Figure 2B:
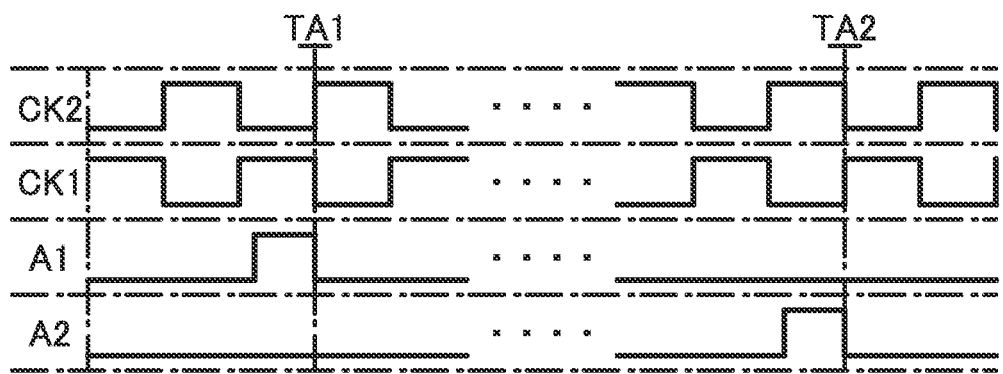
FIG. 2B illustrates signal waveforms.

FIG. 2B illustrates waveforms of the signals in FIG. 2A. As illustrated in FIG. 2B, the signals are input to the scan lines 101 and 102 in FIG. 2A so that timings (TA1 and TA2) at which the input signals are switched from the high power supply potential (VDD) to the low power supply potential (VSS) correspond to timings at which the clock signals (CK1 and CK2) are switched from the low power supply potential (VSS) to the high power supply potential (VDD). Note that the duty ratio or the like of the clock signals (CK1 and CK2) can be changed as appropriate.

In the case of the configuration as illustrated in FIG. 2A, wirings serving as input paths of the clock signals (CK1 and CK2) are not necessarily provided collectively on one side of a display region, and can be separately provided on both sides to face each other. Thus, it is possible to reduce the frame width of a display device including a display region at the center (to achieve a narrowed frame width).

Note that although the transistors included in the display device are the n-channel transistors in FIGS. 2A and 2B, the transistors may be p-channel transistors.

Figure 3:
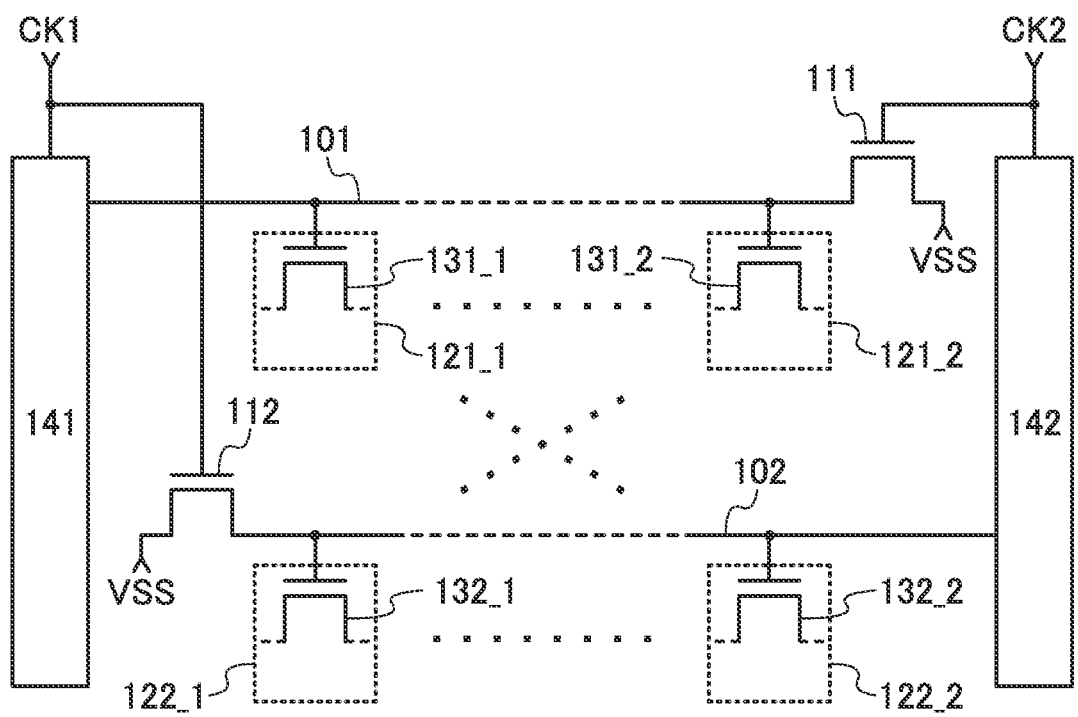
FIG. 3 illustrates a configuration example of a display device.

In FIG. 3, a shift register 141 is provided on the left side of the configuration illustrated in FIG. 2A and a shift register 142 is provided on the right side thereof. Note that the shift register 141 is a circuit to which the clock signal (CK1) is input and which outputs a signal to the scan line 101. The shift register 142 is a circuit to which the clock signal (CK2) is input and which outputs a signal to the scan line 102.

In the configuration of FIG. 3, as in the configuration of FIG. 2A, a narrowed frame width can be achieved. In the configuration of FIG. 3, the clock signals (CK1 and CK2) are used not only to control switching of the transistors 111 and 112 but also to operate the shift registers 141 and 142. Consequently, it is possible to achieve a narrowed frame width efficiently in the configuration of FIG. 3.

Note that there is no particular limitation on the structures of the shift registers 141 and 142. For example, the shift registers 141 and 142 may each include a complementary metal oxide semiconductor (CMOS) circuit using both a p-channel transistor and an n-channel transistor, or may each include the p-channel transistor or the n-channel transistor. In the case where the shift registers 141 and 142 each include a CMOS circuit, power consumption of the shift registers 141 and 142 can be reduced, which is preferable. In the case where the shift registers 141 and 142 each include transistors with the same polarity as the transistors 111, 112, 131_1, 131_2, 132_1, and 132_2, the number of manufacturing steps can be reduced, which is preferable.

<2. Specific Example of Display Device>

Figure 4A:
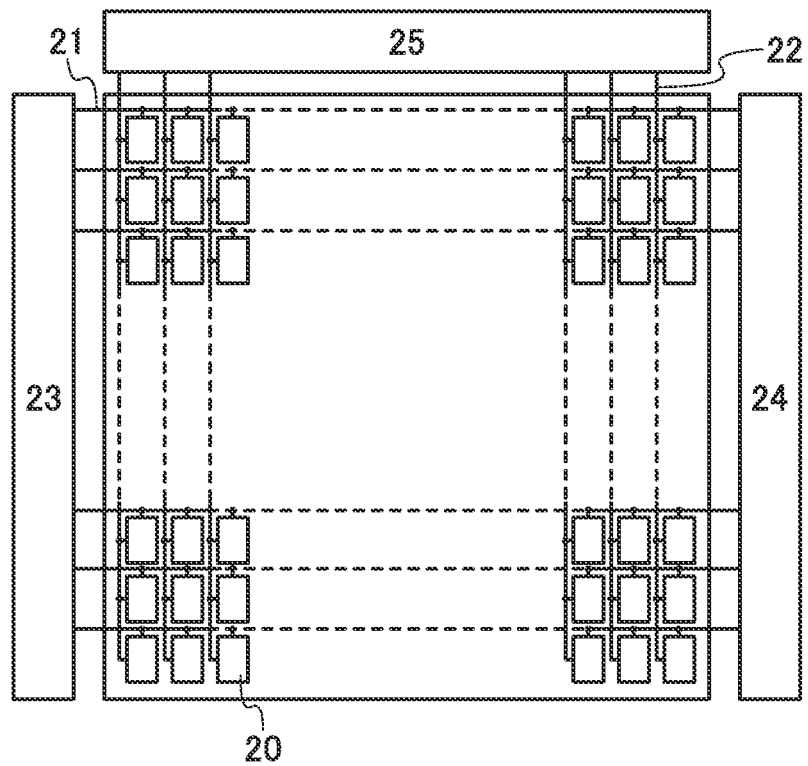
FIG. 4A illustrates a specific example of a display device.

FIG. 4A illustrates a specific example of the display device. A display device in FIG. 4A includes m×n pixels 20 arranged in m rows and n columns (m and n are even numbers), m scan lines 21 extending in the horizontal direction in FIG. 4A between the pixels, n signal lines 22 extending in the vertical direction in FIG. 4A between the pixels, scan line driver circuits 23 and 24 each of which is connected to the m scan lines 21, and a signal line driver circuit 25 connected to the n signal lines 22.

<(1) Configuration Example of Pixel 20>

Figure 4B:
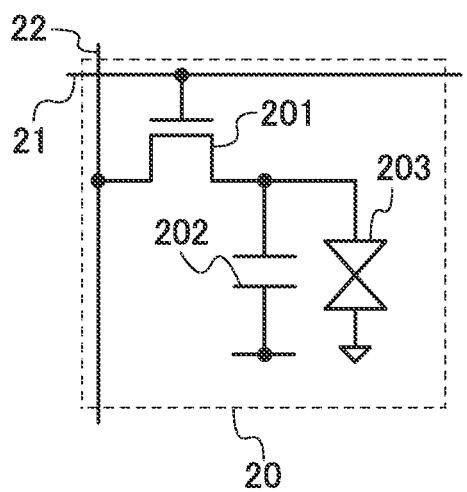
FIG. 4B illustrates a configuration example of a pixel.

FIG. 4B is an example of a circuit diagram of the pixel 20 included in the display device illustrated in FIG. 4A. The pixel 20 in FIG. 4B includes a transistor 201, a capacitor 202, and a liquid crystal element 203. A gate of the transistor 201 is electrically connected to the scan line 21, and one of a source and a drain of the transistor 201 is electrically connected to the signal line 22. One electrode of the capacitor 202 is electrically connected to the other of the source and the drain of the transistor 201, and the other electrode of the capacitor 202 is electrically connected to a wiring for supplying a capacitor potential (the wiring is also referred to as a capacitor wiring). One electrode of the liquid crystal element 203 is electrically connected to the other of the source and the drain of the transistor 201 and the one electrode of the capacitor 202, and the other electrode of the liquid crystal element 203 is electrically connected to a wiring for supplying a common potential (the wiring is also referred to as a common potential line). The capacitor potential and the common potential can be the same potential. Although the liquid crystal element 203 is provided in the pixel 20 in FIG. 4B, the structure of the pixel in the display device disclosed in this specification is not limited to this structure. For example, it is possible to provide a light-emitting element in the pixel in the display device disclosed in this specification.

<(2) Configuration Examples of Scan Line Driver Circuits 23 and 24>

Figure 5:
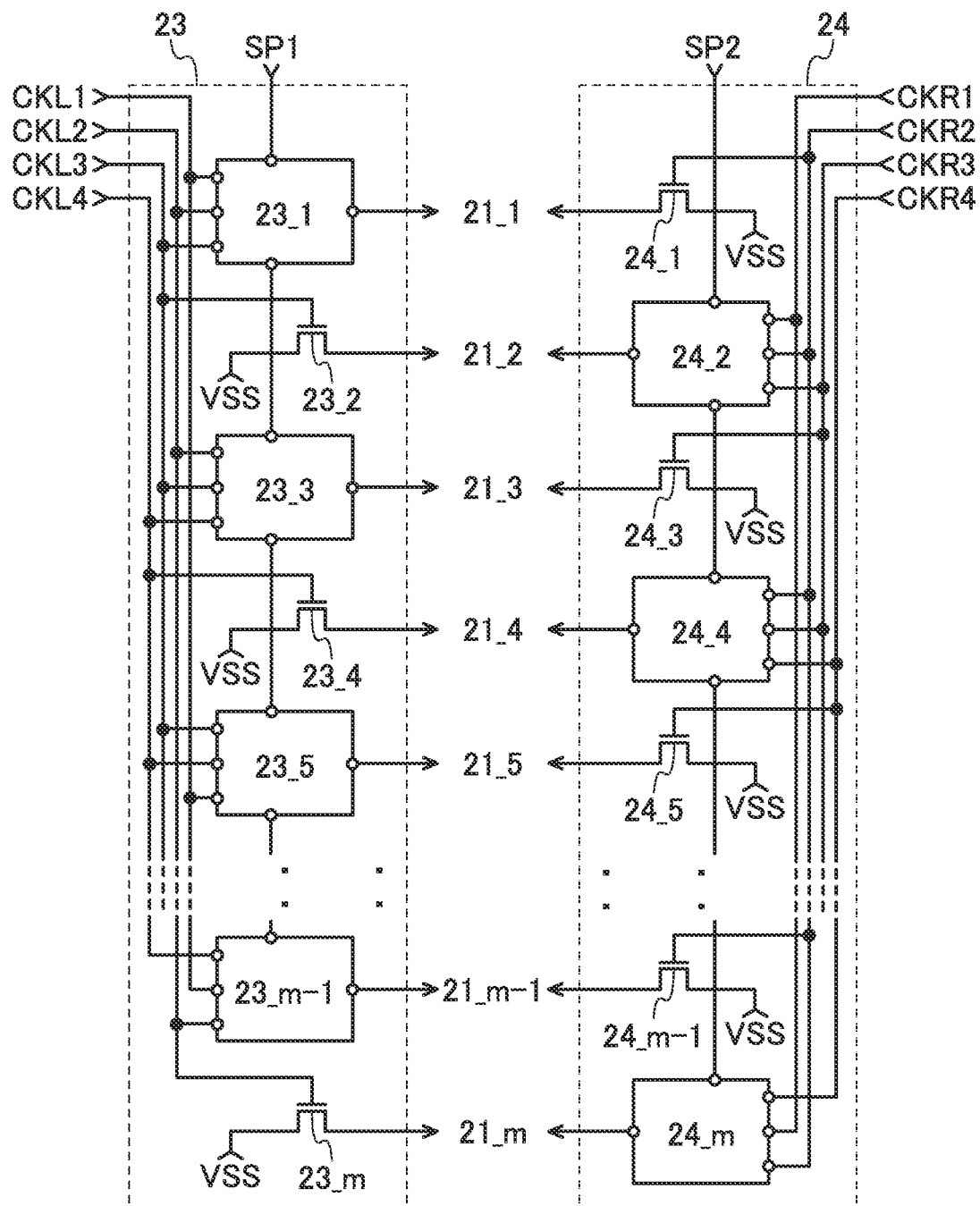
FIG. 5 illustrates a configuration example of a scan line driver circuit.

FIG. 5 illustrates configuration examples of the scan line driver circuits 23 and 24 included in the display device in FIG. 4A. The scan line driver circuit 23 in FIG. 5 includes four wirings each of which supplies any of clock signals (CKL1 to CKL4); a plurality of pulse output circuits 23_1, 23_3 . . . , and 23_$m$−1 each of which is connected to any one of a plurality of scan lines 21_1, 21_3 . . . , and 21_$m$−1 arranged in the odd-numbered rows and a plurality of transistors 23_2, 23_4 . . . , and 23_$m$ in each of which a gate is connected to any one of the four wirings, a source is connected to a wiring for supplying the low power supply potential (VSS) (hereinafter the wiring is also referred to as a low power supply potential line), and a drain is connected to any one of a plurality of scan lines 21_2, 21_4 . . . , and 21_$m$ arranged in the even-numbered rows. The scan line driver circuit 24 in FIG. 5 includes four wirings each of which supplies any one of clock signals (CKR1 to CKR4); a plurality of pulse output circuits 24_2, 24_4 . . . , and 24_$m$ each of which is connected to any one of the plurality of scan lines 21_2, 21_4 . . . , and 21_$m$ arranged in the even-numbered rows; and a plurality of transistors 24_1, 24_3..., and 24_*m*−1 in each of which a gate is connected to any one of the four wirings, a source is connected to the low power supply potential line, and a drain is connected to any one of the plurality of scan lines 21_1, 21_3 . . . , and 21_*m*−1 arranged in the odd-numbered rows. Note that in the scan line driver circuit 23 in FIG. 5, a shift register is composed of the pulse output circuits 23_1, 23_3 . . . , and 23_*m*−1, and in the scan line driver circuit 24 in FIG. 5, a shift register is composed of the pulse output circuits 24_2, 24_4 . . . , and 24_*m*.

Figure 6A:
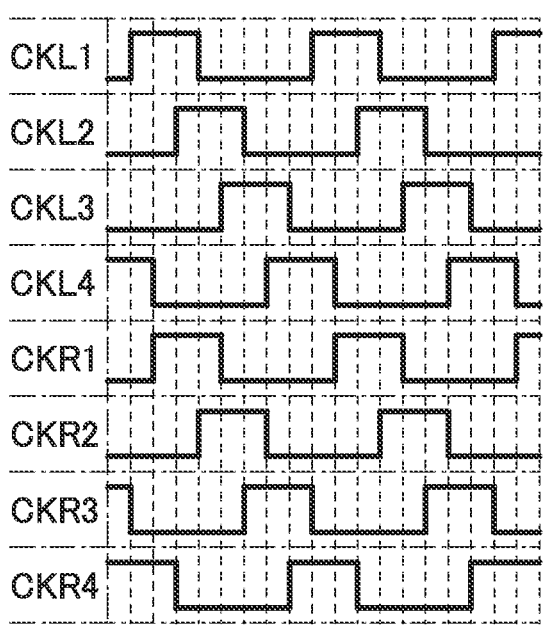
FIG. 6A illustrates waveforms of clock signals.

FIG. 6A illustrates a specific example of the waveforms of the clock signals (CKL1 to CKL4 and CKR1 to CKR4). The clock signal (CKL1) in FIG. 6A periodically alternates between a high-level potential (the high power supply potential (VDD)) and a low-level potential (the low power supply potential (VSS)), and has a duty ratio of 3/8. The phase of the clock signal (CKL2) is shifted from the clock signal (CKL1) by ¼ period, the phase of the clock signal (CKL3) is shifted from the clock signal (CKL1) by ½ period, and the phase of the clock signal (CKL4) is shifted from the clock signal (CKL1) by ¾ period. The phase of the clock signal (CKR1) is shifted from the clock signal (CKL1) by ⅛ period, the phase of the clock signal (CKR2) is shifted from the clock signal (CKL1) by ⅜ period, the phase of the clock signal (CKR3) is shifted from the clock signal (CKL1) by ⅝ period, and the phase of the clock signal (CKR4) is shifted from the clock signal (CKL1) by ⅞ period.

In the above-described display device, circuits with the same configuration can be used as the pulse output circuits 23_1, 23_3 . . . , and 23_*m*−1 and the pulse output circuits 24_2, 24_4 . . . , and 24_*m*. However, electrical connections of a plurality of terminals are different in the pulse output circuits. Specific connection relation is described with reference to FIG. 5 and FIG. 6B.

Other than the pulse output circuits 23_*m*−1 and 24_*m*, the pulse output circuits each include terminals 31 to 36. Note that the terminals 31 to 34 are input terminals, and the terminals 35 and 36 are output terminals. The pulse output circuits 23_*m*−1 and 24_*m* each include the terminals 31 to 35.

First, the terminal 31 is described. The terminal 31 of the pulse output circuit 23_1 is connected to a wiring for supplying a start pulse (SP1), and the terminal 31 of the pulse output circuit 23_2*a*−1 (a is a natural number of 2 or more and m/2 or less) is connected to the terminal 36 of the pulse output circuit 23_2*a*−3. The terminal 31 of the pulse output circuit 242 is connected to a wiring for supplying a start pulse (SP2), and the terminal 31 of the pulse output circuit 24_2*a* is connected to the terminal 36 of the pulse output circuit 24_2*a*−2.

Next, the terminal 32 is described. The terminal 32 of the pulse output circuit 23_8*b*−7 (b is a natural number of m/8 or less) is connected to the wiring for supplying the clock signal (CKL1), the terminal 32 of the pulse output circuit 23_8*b*−5 is connected to the wiring for supplying the clock signal (CKL2), the terminal 32 of the pulse output circuit 23_8*b*−3 is connected to the wiring for supplying the clock signal (CKL3), and the terminal 32 of the pulse output circuit 23_8*b*−1 is connected to the wiring for supplying the clock signal (CKL4). The terminal 32 of the pulse output circuit 24_8*b*−6 is connected to the wiring for supplying the clock signal (CKR1), the terminal 32 of the pulse output circuit 24_8*b*−4 is connected to the wiring for supplying the clock signal (CKR2), the terminal 32 of the pulse output circuit 24_8*b*−2 is connected to the wiring for supplying the clock signal (CKR3), and the terminal 32 of the pulse output circuit 24_8*b* is connected to the wiring for supplying the clock signal (CKR4).

Next, the terminal 33 is described. The terminal 33 of the pulse output circuit 23_8*b*−7 is connected to the wiring for supplying the clock signal (CKL2), the terminal 33 of the pulse output circuit 23_8*b*−5 is connected to the wiring for supplying the clock signal (CKL3), the terminal 33 of the pulse output circuit 23_8*b*−3 is connected to the wiring for supplying the clock signal (CKL4), and the terminal 33 of the pulse output circuit 23_8*b*−1 is connected to the wiring for supplying the clock signal (CKL1). The terminal 33 of the pulse output circuit 24_8*b*−6 is connected to the wiring for supplying the clock signal (CKR2), the terminal 33 of the pulse output circuit 24_8*b*−4 is connected to the wiring for supplying the clock signal (CKR3), the terminal 33 of the pulse output circuit 24_8*b*−2 is connected to the wiring for supplying the clock signal (CKR4), and the terminal 33 of the pulse output circuit 24_8*b* is connected to the wiring for supplying the clock signal (CKR1).

Next, the terminal 34 is described. The terminal 34 of the pulse output circuit 23_8*b*−7 is connected to the wiring for supplying the clock signal (CKL3), the terminal 34 of the pulse output circuit 23_8*b*−5 is connected to the wiring for supplying the clock signal (CKL4), the terminal 34 of the pulse output circuit 23_8*b*−3 is connected to the wiring for supplying the clock signal (CKL1), and the terminal 34 of the pulse output circuit 23_8*b*−1 is connected to the wiring for supplying the clock signal (CKL2). The terminal 34 of the pulse output circuit 24_8*b*−6 is connected to the wiring for supplying the clock signal (CKR3), the terminal 34 of the pulse output circuit 24_8*b*−4 is connected to the wiring for supplying the clock signal (CKR4), the terminal 34 of the pulse output circuit 24_8*b*−2 is connected to the wiring for supplying the clock signal (CKR1), and the terminal 34 of the pulse output circuit 24_8*b* is connected to the wiring for supplying the clock signal (CKR2).

Next, the terminal 35 is described. The terminal 35 of each of the pulse output circuits 23_2*x*−1 and 24_2*x* (x is a natural number less than or equal to m) is connected to the scan line 21_*x* arranged in the x-th row.

The connection relation of the terminals 36 of the pulse output circuits (excluding the pulse output circuits 23_*m*−1 and 24_*n*) is described above. Therefore, the above description is to be referred to.

<(2-1) Configuration Example of Pulse Output Circuit>

Figure 6B:
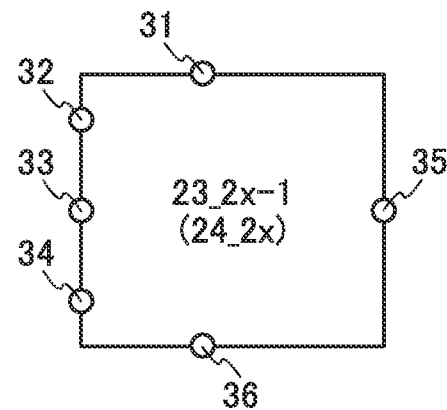
FIG. 6B illustrates a pulse output circuit.
Figure 7A:
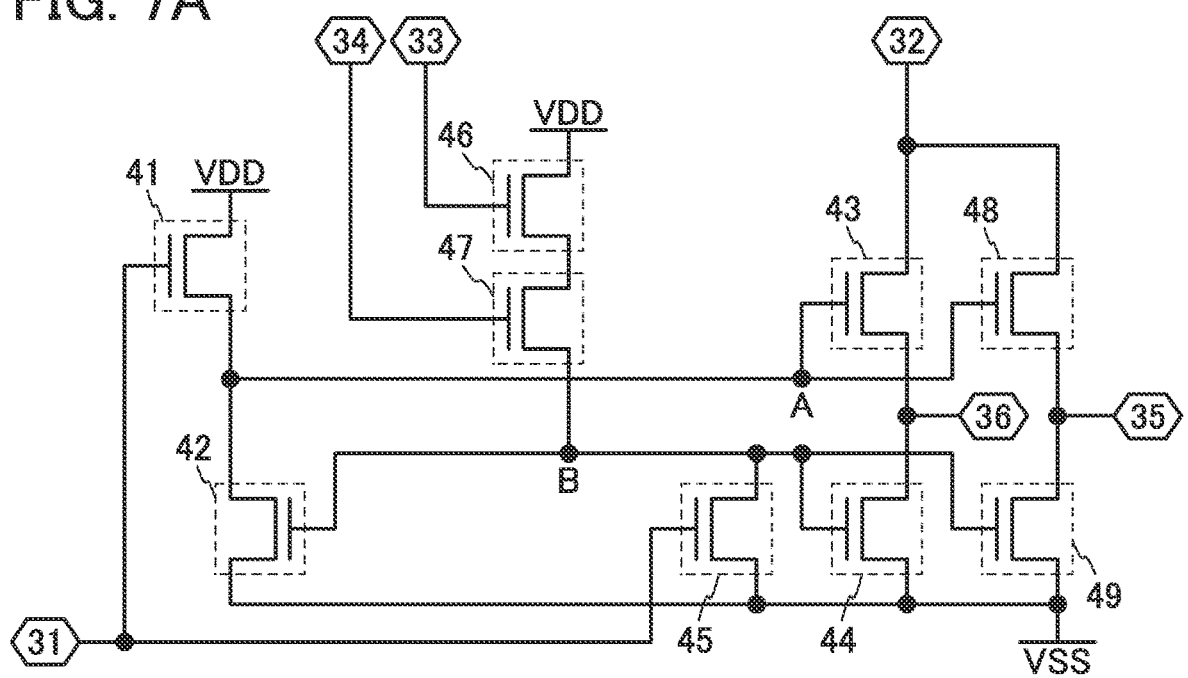
FIG. 7A illustrates a configuration example of a pulse output circuit.

FIG. 7A illustrates a configuration example of the pulse output circuits illustrated in FIG. 5 and FIG. 6B. A pulse output circuit in FIG. 7A includes transistors 41 to 49. Note that the transistors 43 and 44 are not necessarily provided in each of the pulse output circuits 23_*m*−1 and 24_*m*.

One of a source and a drain of the transistor 41 is electrically connected to a wiring for supplying the high power supply potential (VDD) (hereinafter also referred to as a high power supply potential line). A gate of the transistor 41 is electrically connected to the terminal 31.

One of a source and a drain of the transistor 42 is connected to the low power supply potential line, and the other of the source and the drain of the transistor 42 is connected to the other of the source and the drain of the transistor 41.

One of a source and a drain of the transistor 43 is connected to the terminal 32; the other of the source and the drain of the transistor 43 is connected to the terminal 36; and a gate of the transistor 43 is connected to the other of the source and the drain of the transistor 41 and the other of the source and the drain of the transistor 42.

One of a source and a drain of the transistor 44 is connected to the low power supply potential line. The other of the source and the drain of the transistor 44 is connected to the terminal 36. A gate of the transistor 44 is connected to a gate of the transistor 42.

One of a source and a drain of the transistor 45 is connected to the low power supply potential line. The other of the source and the drain of the transistor 45 is connected to the gate of the transistor 42 and the gate of the transistor 44. A gate of the transistor 45 is connected to the terminal 31.

One of a source and a drain of the transistor 46 is connected to the high power supply potential line; and a gate of the transistor 46 is connected to the terminal 33. Note that it is possible to employ a structure in which one of the source and the drain of the transistor 46 is connected to a wiring for supplying a power supply potential (VCC) which is higher than the low power supply potential (VSS) and lower than the high power supply potential (VDD).

One of a source and a drain of the transistor 47 is connected to the other of the source and the drain of the transistor 46; the other of the source and the drain of the transistor 47 is connected to the gate of the transistor 42, the gate of the transistor 44, and the other of the source and the drain of the transistor 45; and a gate of the transistor 47 is connected to the terminal 34.

One of a source and a drain of the transistor 48 is connected to the terminal 32; the other of the source and the drain of the transistor 48 is connected to the terminal 35; and a gate of the transistor 48 is connected to the other of the source and the drain of the transistor 41, the other of the source and the drain of the transistor 42, and the gate of the transistor 43.

One of a source and a drain of the transistor 49 is connected to the low power supply potential line; the other of the source and the drain of the transistor 49 is connected to the terminal 35; and a gate of the transistor 49 is connected to the gate of the transistor 42, the gate of the transistor 44, the other of the source and the drain of the transistor 45, and the other of the source and the drain of the transistor 47.

In the following description, a node where the other of the source and the drain of the transistor 41, the other of the source and the drain of the transistor 42, the gate of the transistor 43, and the gate of the transistor 48 are connected to each other is referred to as a node A; a node where the gate of the transistor 42, the gate of the transistor 44, the other of the source and the drain of the transistor 45, the other of the source and the drain of the transistor 47, and the gate of the transistor 49 are connected to each other is referred to as a node B.

<(2-2) Operation Example of Pulse Output Circuit>

Figure 7B:
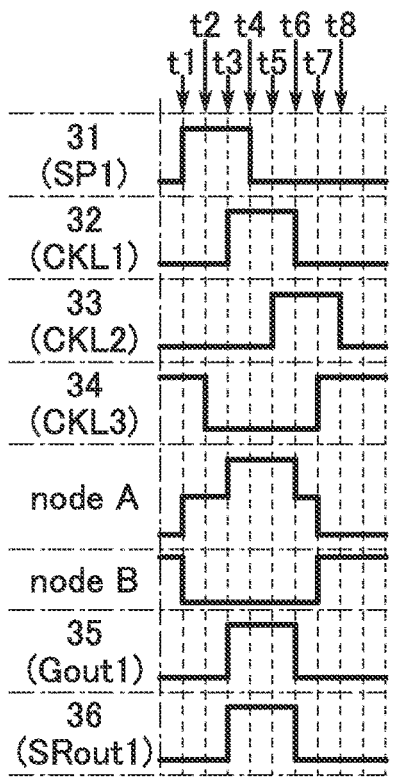
FIGS. 7B and 7C illustrate signal waveforms and changes in the potentials of nodes.
Figure 7C:
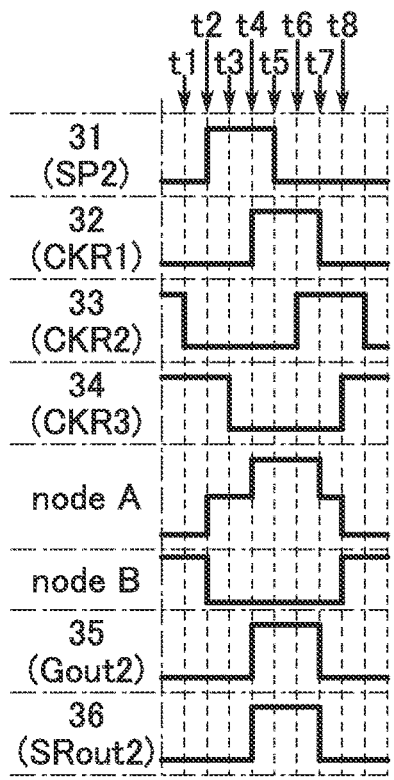

An operation example of the above-described pulse output circuit is described with reference to FIGS. 7B and 7C. FIG. 7B illustrates the waveforms of the signals input and output to/from the pulse output circuit 23_1, and the potentials of nodes A and B in the pulse output circuit 23_1. FIG. 7C illustrates the waveforms of the signals input and output to/from the pulse output circuit 24_2, and the potentials of nodes A and B in the pulse output circuit 24_2. Note that in FIGS. 7B and 7C, Gout represents an output signal from the pulse output circuit to the scan line, and SRout represents an output signal from the pulse output circuit to the subsequent-stage pulse output circuit.

First, the operation of the pulse output circuit 23_1 is described with reference to FIG. 7B.

At a timing t1, the high-level potential (the high power supply potential (VDD)) is input to the terminal 31. Accordingly, the transistors 41 and 45 are on. Thus, the potential of the node A is raised to the high-level potential (a potential lower than the high power supply potential (VDD) by the threshold voltage of the transistor 41); at this time, the transistor 41 is turned off. In addition, the potential of the node B is lowered to the low power supply potential (VSS); consequently, the transistors 43 and 48 are turned on, and the transistors 42, 44, and 49 are turned off. In the above manner, a signal input to the terminal 32 is output from the terminals 35 and 36. Here, the signal input to the terminal 32 has the low-level potential (the low power supply potential (VSS)). Therefore, the pulse output circuit 23_1 outputs the low-level potential (the low power supply potential (VSS)) to the terminal 31 of the pulse output circuit 23_3 and the scan line 21_1.

At a timing t2, the low-level potential (the low power supply potential (VSS)) is input to the terminal 34. Note that the signals output from the terminal 35 and the terminal 36 do not change, and the pulse output circuit 231 outputs the low-level potential (the low power supply potential (VSS)) to the terminal 31 of the pulse output circuit 233 and the scan line 21_1.

At a timing t3, the high-level potential (high power supply potential (VDD)) is input to the terminal 32. Note that the potential of the node A (potential of the other of the source and the drain of the transistor 41) is increased to a high-level potential (potential which is decreased from the high power supply potential (VDD)) by the threshold voltage of the transistor 41) at the timing 3. Thus, the transistor 41 is off. As this time, the high-level potential (high power supply potential (VDD)) is input to the terminal 32, whereby the potential of the node A (potentials of the gates of the transistors 43 and 48) is further increased by capacitive coupling between the sources and the gates of the transistors 43 and 48 (bootstrap operation). Owing to the bootstrapping, the potential of the signals output from the terminals 35 and 36 are not decreased from the high-level potential (high power supply potential (VDD)) input to the terminal 32. Therefore, the pulse output circuit 231 outputs the high-level potential (the high power supply potential (VDD)) to the terminal 31 of the pulse output circuit 233 and the scan line 21_1.

At a timing t4, the low-level potential (the low power supply potential (VSS)) is input to the terminal 31; and at a timing t5, the high-level potential (the high power supply potential (VDD)) is input to the terminal 33. Note that the signals output from the terminal 35 and the terminal 36 do not change, and the pulse output circuit 23_1 outputs the high-level potential (the high power supply potential (VDD)) to the terminal 31 of the pulse output circuit 23_3 and the scan line 21_1.

At a timing t6, the low-level potential (the low power supply potential (VSS)) is input to the terminal 32. At this time, capacitive coupling between the sources and the gates of the transistors 43 and 48 lowers the potential of the node A (the potentials of the gates of the transistors 43 and 48) (i.e., bootstrap operation). Note that the potential of the node A is kept at a high level. Accordingly, the transistors 43 and 48 are kept in an on state. Thus, the signal input to the terminal 32 is output from the terminals 35 and 36. That is, the pulse output circuit 23_1 outputs the low-level potential (the low power supply potential (VSS)) to the terminal 31 of the pulse output circuit 23_3 and the scan line 21_1.

At a timing t7, the high-level potential (the high power supply potential (VDD)) is input to the terminal 34. In addition, the high-level potential (the high power supply potential (VDD)) is also input to the terminal 33 at the timing t7. Accordingly, the transistors 46 and 47 are turned on. Thus, the potential of the node B is raised to the high-level potential (a potential lower than the high power supply potential (VDD) by either of a higher threshold voltage of the transistors 46 and 47). Thus, the transistors 42, 44, and 49 are turned on; accordingly, the potential of the node A is lowered to the low-level potential (the low power supply potential (VSS)). Thus, the transistors 43 and 48 are turned off. In the above manner, at the timing t7, signals input to one of the source and the drain of each of the transistors 44 and 49 are output from the terminals 35 and 36. The signals of course have the low power supply potential (VSS). Therefore, a signal output from the pulse output circuit 23_1 to the terminal 31 of the pulse output circuit 23_3 and the scan line 21_1 is kept at the low-level potential (the low power supply potential (VSS)).

Next, the operation of the pulse output circuit 242 is described. As illustrated in FIG. 7C, the pulse output circuit 242 is operated in the same manner as the pulse output circuit 23_1. Note that the pulse output circuit 24_2 is operated with the clock signals (CKL1 to CKL4 and CKR1 to CKR4) which are delayed from those in the case of the pulse output circuit 231 by one-eighth of the cycle of the clock signals.

<(2-3) Operation Example of Transistors 23_2 . . . , and 23_m and Transistors 24_1 . . . , and 24_m−1>

Figure 8A:
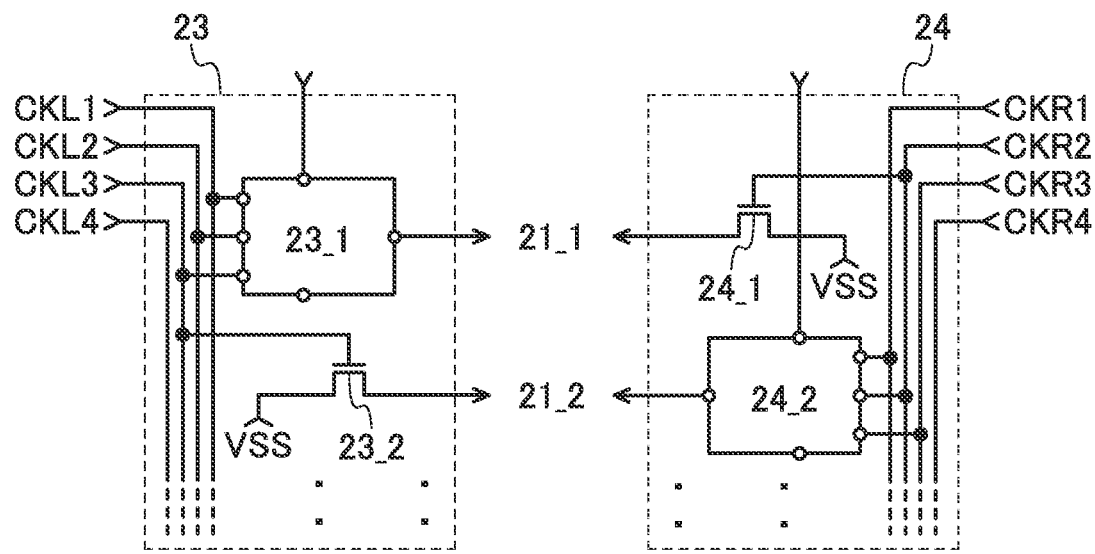
FIG. 8A illustrates a configuration example of a scan line driver circuit.
Figure 8B:
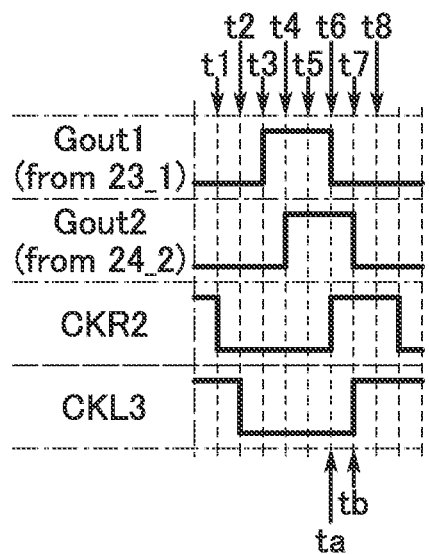
FIG. 8B illustrates signal waveforms.

The operation of the transistors 23_2 . . . , and 23_m and transistors 24_1 . . . , and 24_m−1 is described with reference to FIGS. 8A and 8B. FIG. 8A illustrates part of the configuration example of FIG. 5. FIG. 8B illustrates the waveforms of signals output from the pulse output circuits 23_1 and 24_2 to the scan lines 21_1 and 21_2 in FIGS. 7B and 7C, and the clock signals (CKR2 and CKL3) input to the gates of the transistors 232 and 24_1.

In the above-described display device, as illustrated in FIG. 8B, a timing (ta) at which the potential of a signal output from the pulse output circuit 23_1 to the scan line 21_1 is switched from the high-level potential (the high power supply potential (VDD)) to the low-level potential (the low power supply potential (VSS)) corresponds to a timing at which the potential of the clock signal (CKR2) is switched from the low-level potential (the low power supply potential (VSS)) to the high-level potential (the high power supply potential (VDD)). That is, the timing (ta) corresponds to a timing at which the transistor 24_1 is turned on. Similar to the above, a timing (tb) at which the potential of a signal output from the pulse output circuit 24_3 to the scan line 21_2 is switched from the high-level potential (the high power supply potential (VDD)) to the low-level potential (the low power supply potential (VSS)) corresponds to a timing at which the transistor 24_1 is turned on. Thus, in the above-described display device, the non-selection signal is input not only to one end but to both ends of the scan line at the same time. This makes it possible to inhibit the potentials of portions in the scan line from being changed at different times. That is, a plurality of transistors whose gates are connected to the scan line is inhibited from being switched at different times. Consequently, it is possible to reduce a problem that occurs in the display device.

Furthermore, in the above-described display device, the clock signals (CKL1 to CKL4 and CKR1 to CKR4) which are used to operate the shift registers are used to control the switching of the transistors 23_2, 23_4 . . . , and 23_m, and transistors 24_1, 24_3 . . . , and 24_m−1. That is, there is no need to provide another wiring for supplying a signal to control switching of the transistors 23_2, 23_4 . . . , and 23_m, and transistors 24_1, 24_3 . . . , and 24_m−1. Thus, in the above-described display device, a narrowed frame width can be efficiently achieved.

<(3) Modification Example of Scan Line Driver Circuits 23 and 24>

The scan line driver circuits 23 and 24 provided in the display device disclosed in this specification are not limited to the above-described circuits. For example, a configuration can be employed in which the gates of the transistors 23_2 . . . , and 23_m are each connected to the terminal 35 of any one of the pulse output circuits 23_1 . . . , and 23_m−1 and the gates of the transistors 24_1 . . . , and 24_n−1 are each connected to the terminal 35 of any one of the pulse output circuits 24_2 . . . , and 24_m−1, instead of the configuration of FIG. 5 in which the gates are each connected to any one of the wirings for supplying the clock signals (CKL1 to CKL4 and CKR1 to CKR4).

Figure 9:
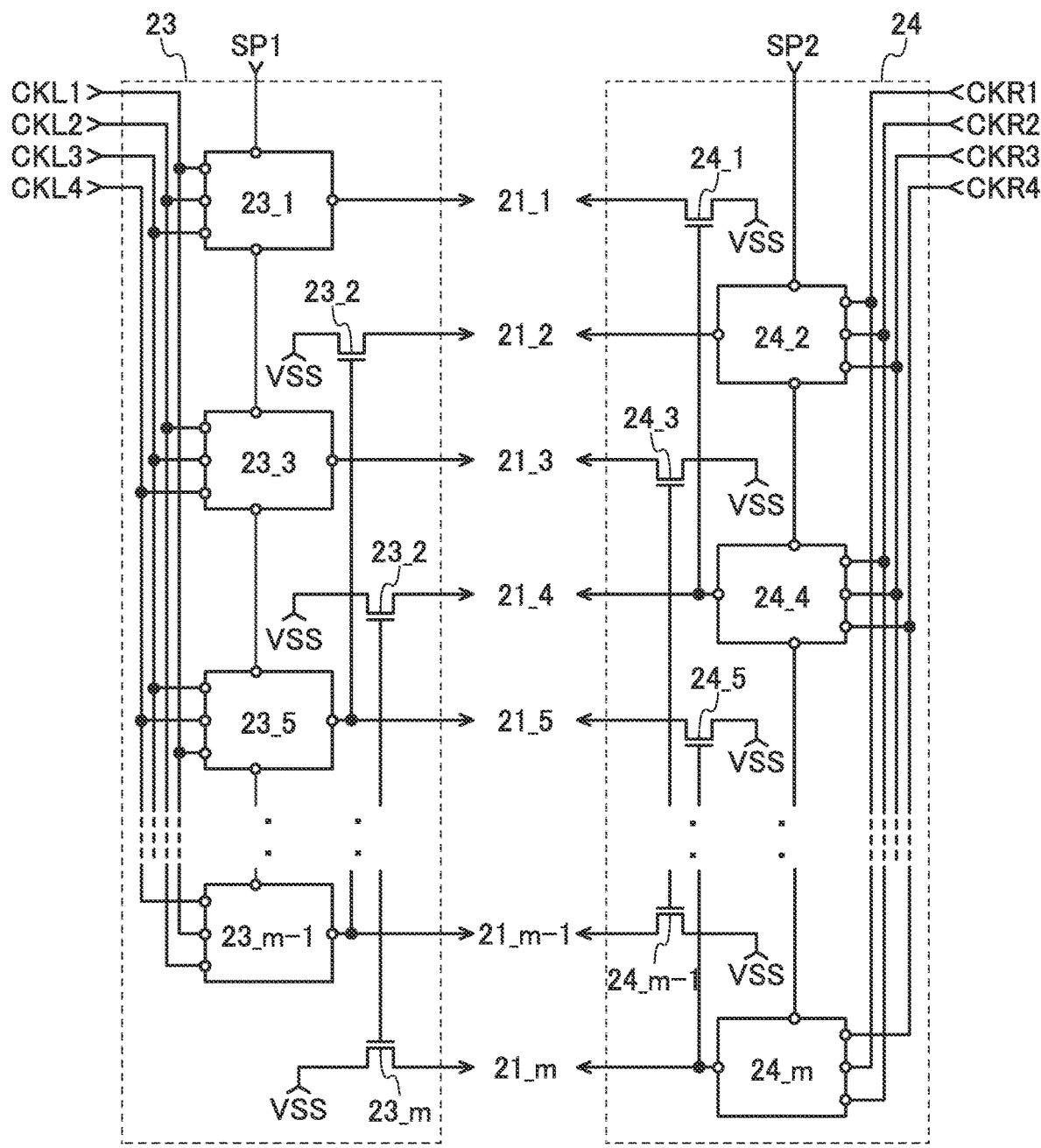
FIG. 9 illustrates a configuration example of a scan line driver circuit.

Specifically, a configuration illustrated in FIG. 9 can be employed as long as the pulse output circuits have the configuration illustrated in FIG. 7A. In the scan line driver circuit 23 in FIG. 9, the gate of the transistor 23_2c (c is an even number of m−4 or less) is connected to the terminal 35 of the pulse output circuit 23_c+3, and the gate of the transistor 24_d (d is an odd number of n−3 or less) is connected to the terminal 35 of the pulse output circuit 24_d+3. Although not illustrated in FIG. 9, the gate of the transistor 23_n−2 is connected to the terminal 35 of the pulse output circuit 23_m−7, the gate of the transistor 23_m is connected to the terminal 35 of the pulse output circuit 23_m−5, and the gate of the transistor 24_m−1 is connected to the terminal 35 of the pulse output circuit 24_m−6 in FIG. 9.

The use of the scan line driver circuits 23 and 24 in FIG. 9 exerts the same effect as the use of the scan line driver circuits 23 and 24 in FIG. 5.

<3. Specific Examples of Transistor>

Any kind of transistor may be used as the transistors included in the above-described display device. For example, a transistor in which a channel is formed in a silicon film (the transistor including a channel formation region in the silicon film) or a transistor in which a channel is formed in an oxide semiconductor film (the transistor including a channel formation region in the oxide semiconductor film) can be used as the transistors included in the above-described display device.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is an oxide semiconductor film having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, a term "parallel" indicates that the angle formed between two straight lines is greater than or equal to $-10°$ and less than or equal to $10°$, and accordingly also includes the case where the angle is greater than or equal to $-5°$ and less than or equal to 5. In addition, a term "perpendicular" indicates that an angle formed between two straight lines is greater than or equal to 800 and less than or equal to $100°$, and accordingly also includes the case where the angle is greater than or equal to $85°$ and less than or equal to $95°$.

According to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Furthermore, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. In contrast, in the case of a CAAC-OS film, a peak is not clearly observed even when φ scan is performed with 2θ fixed at around 56°.

According to the above results, in the CAAC-OS film, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface.

Distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. When an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has a higher strength of bonding to oxygen than that of a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor using the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor using the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In an image obtained with the TEM, crystal parts cannot be found clearly in the microcrystalline oxide semiconductor film in some cases. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to the diameter of a crystal part. Further, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has higher regularity than an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more of an amorphous oxide semiconductor film, a microcrystalline oxide semiconductor film, and a CAAC-OS film, for example.

<4. Specific Example of Display Module>

A display module including the above-described display device as a component is described below with reference to FIG. 10.

Figure 10:
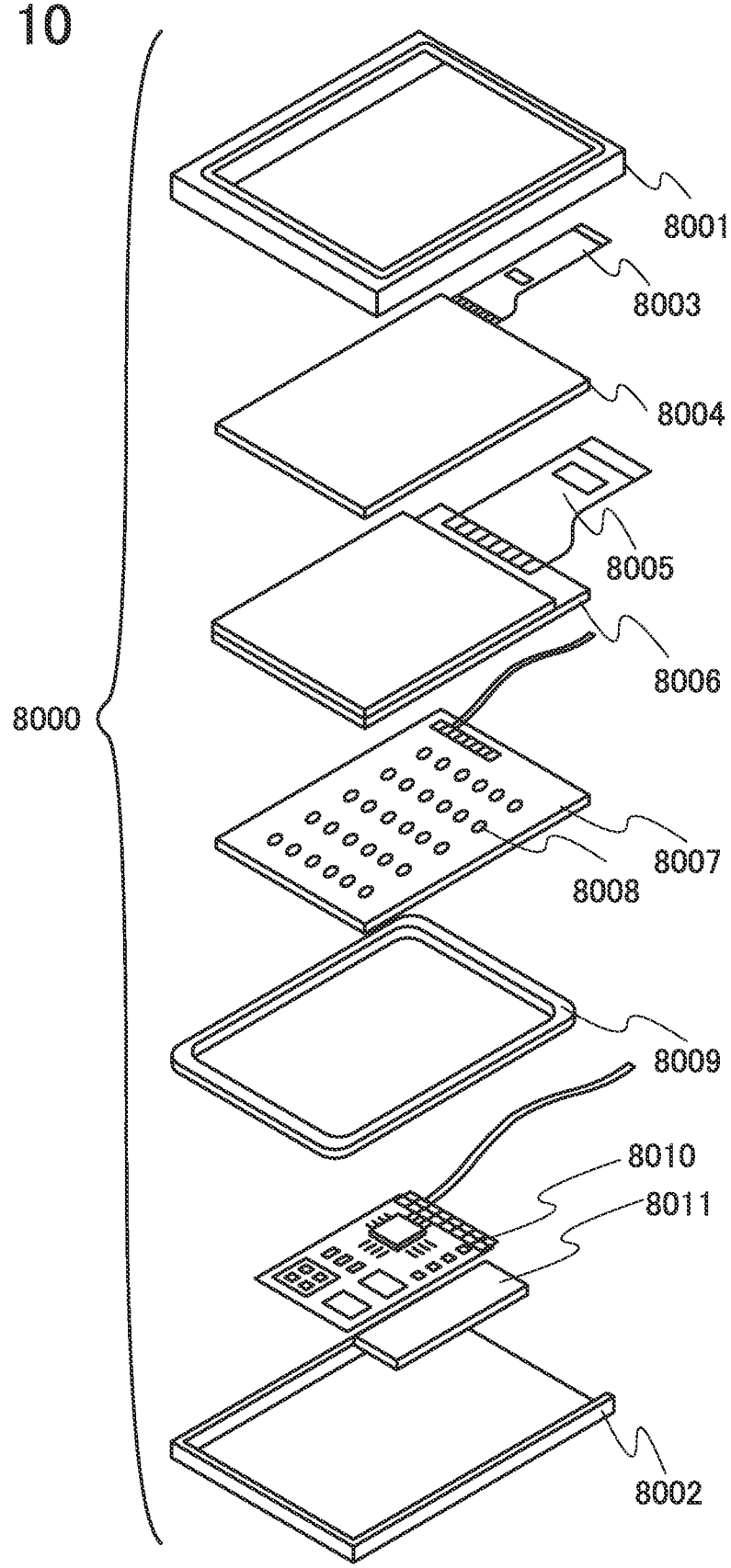
FIG. 10 illustrates an example of a display module.

In a display module 8000 illustrated in FIG. 10, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that as the structure of the display module, a structure can also be employed in which at least one of these components is not provided (e.g., the backlight unit 8007, the battery 8011, or the touch panel 8004 is not provided).

The above-described display device corresponds to the display panel 8006.

The shapes and sizes of the upper cover 8001 and the lower cover 8002 can be changed as appropriate in accordance with the sizes of the touch panel 8004 and the display panel 8006.

The touch panel 8004 is a resistive touch panel or a capacitive touch panel and overlaps with the display panel 8006. A counter substrate (sealing substrate) of the display panel 8006 can have a touch panel function. A photosensor may be provided in each pixel of the display panel 8006 so that the touch panel 8004 can function as an optical touch panel. An electrode for a touch sensor may be provided in each pixel of the display panel 8006 so that a capacitive touch panel is obtained.

The backlight unit 8007 includes a plurality of light sources 8008 arranged in matrix. Note that the backlight unit 8007 may have a structure including a linear light source and a light diffusing plate. In this case, in the backlight unit 8007, linear light from the linear light source is diffused by the light diffusion plate and emitted as plane light.

The frame 8009 protects the display panel 8006 and functions as an electromagnetic shield for blocking electromagnetic waves generated by the operation of the printed board 8010. The frame 8009 can function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

<5. Specific Examples of End Product>

Examples of an end product including the above-described display device are described below with reference to FIGS. 11A and 11B and FIGS. 12A and 12B.

Examples of the end product include television devices (also referred to as TVs or television receivers), monitors for computers and the like, cameras such as digital cameras and digital video cameras, digital photo frames, mobile phones (also referred to as cellular phones or portable telephone devices), portable game machines, portable information terminals, audio reproducing devices, and large game machines such as pachinko machines. Note that these end products can have a curved display surface or a display surface that can be folded arbitrarily.

Figure 11A:
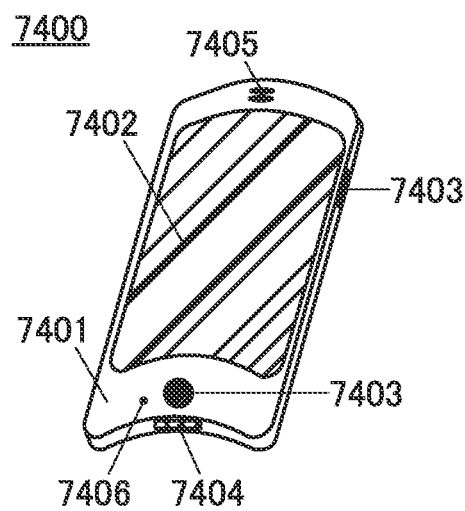
FIG. 11A illustrates an example of a mobile phone.

FIG. 11A illustrates an example of a mobile phone. A mobile phone 7400 includes a display portion 7402 incorporated in a housing 7401, an operation button 7403, an external connection port 7404, a speaker 7405, a microphone 7406, and the like. Note that in the mobile phone 7400, the above-described display device is incorporated in the display portion 7402.

The surface of the display portion 7402 of the mobile phone 7400 in FIG. 11A is touched with a finger or the like to operate the mobile phone, for example, to change a displayed image. Operations such as making a call and inputting a letter can be also performed by touch on the surface of the display portion 7402 with a finger or the like.

With the operation button 7403, start-up and shutdown of the mobile phone 7400 and the above-described operation can be performed.

Figure 11B:
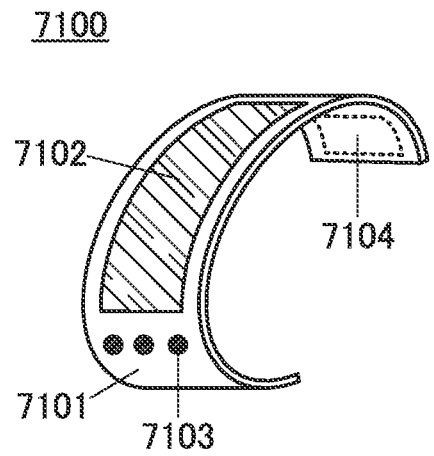
FIG. 11B illustrates an example of a bangle display device.

FIG. 11B illustrates an example of a bangle display device. A bangle display device 7100 includes a housing 7101, a display portion 7102, operation buttons 7103, and a sending and receiving device 7104. Note that in the bangle display device 7100, the above-described display device is incorporated in the display portion 7102.

The bangle display device 7100 can receive a video signal with the sending and receiving device 7104 and can display the received video on the display portion 7102. In addition, with the sending and receiving device 7104, the bangle display device 7100 can send and receive an audio signal to/from another sending and receiving device.

With the operation buttons 7103, start-up and shutdown of the bangle display device 7100, operation such as changing a displayed image, adjusting volume, and the like can be performed.

Figure 12A:
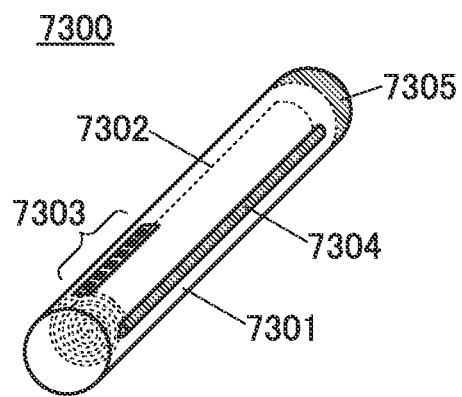
FIGS. 12A and 12B illustrate an example of a portable device.

FIG. 12A illustrates an example of a portable device. A portable device 7300 includes a housing 7301, a display portion 7302, operation buttons 7303, a display portion pull 7304, and a control portion 7305. Note that in the portable device 7300, the above-described display device is incorporated in the display portion 7302.

In the portable device 7300, the flexible display portion 7302 is rolled and included in the cylindrical housing 7301. The display portion 7302 includes a first substrate provided with a light-blocking layer and the like and a second substrate provided with a transistor and the like. The display portion 7302 is rolled so that the second substrate is positioned against an inner wall of the housing 7301.

The portable device 7300 can receive a video signal with the control portion 7305 and can display the received video on the display portion 7302. In addition, a battery is included in the control portion 7305. A connector may be included in the control portion 7305 so that a video signal or power can be directly supplied.

With the operation buttons 7303, start-up and shutdown of the portable device 7300, operation such as changing a displayed image, and the like can be performed.

Figure 12B:
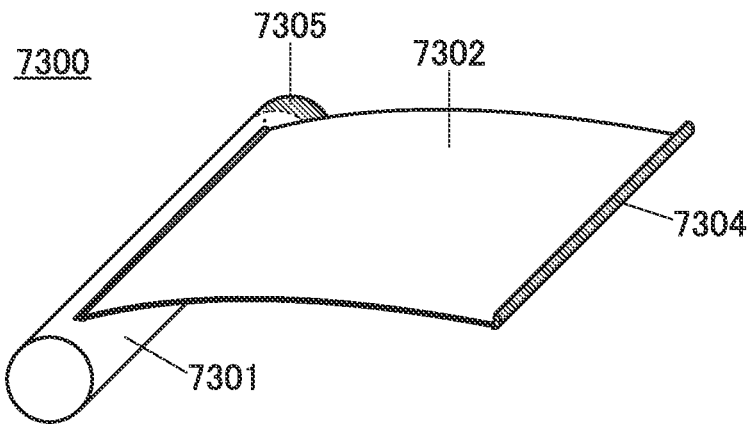

FIG. 12B illustrates a state in which the display portion 7302 is pulled out with the display portion pull 7304. Videos can be displayed on the display portion 7302 in this state. The operation buttons 7303 on the surface of the housing 7301 allow one-handed operation.

Note that a reinforcement frame may be provided for an edge portion of the display portion 7302 in order to prevent the display portion 7302 from being curved when pulled out.

Note that in addition to this structure, a speaker may be provided for the housing so that sound is output with an audio signal received together with a video signal.

This application is based on Japanese Patent Application serial no. 2013-189539 filed with Japan Patent Office on Sep. 12, 2013, the entire contents of which are hereby incorporated by reference.

What is claimed is:

1. A display device comprising:
a first scan line;
a second scan line positioned next to the first scan line;
a first pulse output circuit configured to output a first signal such that the first signal is supplied from one end of the first scan line to the first scan line;
a second pulse output circuit configured to output a second signal such that the second signal is supplied from one end of the second scan line to the second scan line;
a first transistor electrically connected to the other end of the first scan line;
a second transistor electrically connected to the other end of the second scan line; and
a pixel portion positioned between the first transistor and the second transistor in a planar view, the pixel portion being electrically connected to the first scan line and the second scan line,
wherein the first scan line is configured such that a first non-selection signal is supplied from the other end of the first scan line through the first transistor,
wherein the second scan line is configured such that a second non-selection signal is supplied from the other end of the second scan line through the second transistor,
wherein the first scan line is configured such that no selection signal is supplied from the other end of the first scan line,
wherein the second scan line is configured such that no selection signal is supplied from the other end of the second scan line,
wherein the other end of the first scan line is not directly connected to any transistor other than the first transistor, and
wherein the other end of the second scan line is not directly connected to any transistor other than the second transistor.

2. The display device according to claim 1, wherein each of the first transistor and the second transistor comprises an oxide semiconductor film comprising a channel formation region.

3. The display device according to claim 1, wherein the first transistor is controlled by a first clock signal, and
wherein the second transistor is controlled by a second clock signal.

4. A display device comprising:
a first scan line;
a second scan line positioned next to the first scan line;
a first shift register configured to output a first signal such that the first signal is supplied from one end of the first scan line to the first scan line;
a second shift register configured to output a second signal such that the second signal is supplied from one end of the second scan line to the second scan line;
a first transistor directly connected to the other end of the first scan line;
a second transistor directly connected to the other end of the second scan line; and
a pixel portion positioned between the first transistor and the second transistor in a planar view, the pixel portion being electrically connected to the first scan line and the second scan line,
wherein the first scan line is configured such that a first non-selection signal is supplied from the other end of the first scan line through the first transistor, wherein the second scan line is configured such that a second non-selection signal is supplied from the other end of the second scan line through the second transistor, wherein the first scan line is configured such that no selection signal is supplied from the other end of the first scan line, wherein the second scan line is configured such that no selection signal is supplied from the other end of the second scan line, wherein the other end of the first scan line is not directly connected to any transistor other than the first transistor outside the pixel portion, wherein the other end of the second scan line is not directly connected to any transistor other than the second transistor outside the pixel portion, and wherein each of the first shift register and the second shift register comprises a CMOS circuit.

5. The display device according to claim 4, wherein the first transistor is controlled by a first clock signal, and wherein the second transistor is controlled by a second clock signal.

* * * * *